(12) United States Patent
Kim

(10) Patent No.: US 11,011,127 B2
(45) Date of Patent: May 18, 2021

(54) DISPLAY APPARATUS

(71) Applicant: LG Display Co., Ltd., Seoul (KR)

(72) Inventor: Taehwi Kim, Busan (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/894,064

(22) Filed: Feb. 12, 2018

(65) Prior Publication Data

US 2019/0189075 A1 Jun. 20, 2019

(30) Foreign Application Priority Data

Dec. 19, 2017 (KR) .......................... 10-2017-0175358

(51) Int. Cl.
| | | |
|---|---|---|
| *G09G 3/36* | (2006.01) | |
| *H01L 27/12* | (2006.01) | |
| *H01L 23/60* | (2006.01) | |
| *G02F 1/1345* | (2006.01) | |
| *G02F 1/1362* | (2006.01) | |
| *G02F 1/1333* | (2006.01) | |

(52) U.S. Cl.
CPC ....... *G09G 3/3677* (2013.01); *G02F 1/13454* (2013.01); *G02F 1/136204* (2013.01); *G02F 1/136286* (2013.01); *H01L 23/60* (2013.01); *H01L 27/1244* (2013.01); *G02F 1/133388* (2021.01); *G02F 2201/56* (2013.01); *G09G 2300/0426* (2013.01); *G09G 2330/04* (2013.01)

(58) Field of Classification Search
CPC ............. G09G 3/3677; G09G 2330/04; G09G 2300/0426; G02F 1/136286; G02F 1/136204; G02F 1/13454; G02F 2001/133388; H01L 23/60; H01L 27/1244
See application file for complete search history.

(56) References Cited

U.S. PATENT DOCUMENTS

| | | | | |
|---|---|---|---|---|
| 2005/0264505 | A1* | 12/2005 | Kim | G09G 3/3677 345/87 |
| 2007/0164954 | A1* | 7/2007 | Yang | G09G 3/3677 345/88 |
| 2009/0115690 | A1* | 5/2009 | Chang | G09G 3/006 345/55 |
| 2015/0194090 | A1* | 7/2015 | Lin | G09G 3/2092 345/205 |
| 2016/0247478 | A1* | 8/2016 | Ishige | G09G 3/3677 |
| 2017/0249916 | A1* | 8/2017 | Jen | G09G 3/3677 |
| 2017/0269448 | A1* | 9/2017 | Chen | G02F 1/133512 |

FOREIGN PATENT DOCUMENTS

KR 10-2016-0001802 A 1/2016

\* cited by examiner

*Primary Examiner* — Amr A Awad
*Assistant Examiner* — Maheen I Javed
(74) *Attorney, Agent, or Firm* — Morgan, Lewis & Bockius LLP

(57) ABSTRACT

A display apparatus includes a substrate having a display area for displaying an image and a non-display area surrounding the display area; a first clock line portion in the non-display area, the first clock line portion having a plurality of gate shift clock lines; a second clock line portion in the non-display area between the first clock line portion and the display area, the second clock line portion having a gate start signal line; and a gate driving built-in circuit in the non-display area between the first clock line portion and the second clock line portion, and connected with the plurality of gate shift clock lines and the gate start signal line.

20 Claims, 8 Drawing Sheets

DISPLAY APPARATUS

This application claims the benefit of the Korean Patent Application No. 10-2017-0175358 filed on Dec. 19, 2017, which is hereby incorporated by reference as if fully set forth herein.

BACKGROUND

Technical Field

Embodiments of the present application relate to a display apparatus.

Discussion of the Related Art

With the advancement of an information-oriented society, a technical field related to a display apparatus for displaying an image or video of visual information has been actively studied and developed. The display apparatus may be widely used for a display screen of various devices, such as a smart phone, a mobile communication terminal, a mobile phone, a tablet personal computer (PC), a smart watch, a watch phone, a wearable device, an electronic notebook, an electronic book, a PMP (portable multimedia player), a navigation, a television, a notebook computer, a monitor, a camera, a camcorder, or home appliances. The display apparatus may include a display panel having a plurality of pixels with respective thin film transistors connected with gate and data lines, a data driving circuit for supplying a data voltage to the data line, and a gate driving circuit for supplying a gate signal to the gate line.

Recently, a display apparatus having a GIP (Gate In Panel) structure has been utilized for simplifying a structure of a circuit component, reducing a manufacturing cost, and realizing a decreased bezel width. In case of the display apparatus having the GIP structure, a gate driving circuit is provided in a non-display area of a display panel for a process of manufacturing a thin film transistor for each pixel.

The gate driving circuit of the GIP structure includes stages for supplying a gate signal to gate lines. An operation of the stage is dependent on a signal supplied through a plurality of gate shift clock lines and a gate start signal line prepared in the display panel.

However, in the case of the related art display apparatus having the gate driving circuit of the GIP structure, the gate start signal line is disposed in the outermost area of the display panel so that the gate start signal line might be damaged or destroyed by static electricity, or there might be defects on driving of the gate driving circuit caused by static electricity.

The above description of the related art display apparatus relates to information relating to the background of the present application. The above description is not necessarily prior art disclosed publicly before an effective date of the present application.

SUMMARY

Accordingly, embodiments of the present disclosure are directed to a display apparatus that substantially obviates one or more of the problems due to limitations and disadvantages of the related art.

An object of the present application is to provide a display apparatus that is capable of preventing defects from occurring by static electricity while driving a gate driving circuit.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display apparatus comprises a substrate including a display area for displaying an image and a non-display area surrounding the display area; a first clock line portion in the non-display area, the first clock line portion having a plurality of gate shift clock lines; a second clock line portion in the non-display area between the first clock line portion and the display area, the second clock line portion having a gate start signal line; and a gate driving built-in circuit in the non-display area between the first clock line portion and the second clock line portion, and connected with the plurality of gate shift clock lines and the gate start signal line.

In another aspect, a display apparatus comprises a substrate having a display area, and a non-display area surrounding the display area; first and second gate driving built-in circuits in the non-display area at opposing sides of the display area such that the display area is interposed between the first and second gate driving built-in circuits; a plurality of first gate shift clock lines connected with the first gate driving built-in circuit; a plurality of second gate shift clock lines connected with the second gate driving built-in circuit; a first gate start signal line connected with the first gate driving built-in circuit; and a second gate start signal line connected with the second gate driving built-in circuit, wherein each of the first and second gate start signal lines is disposed closer to the display area in comparison to the first and second gate shift clock lines, respectively.

It is to be understood that both the foregoing general description and the following detailed description of embodiments of the present application are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
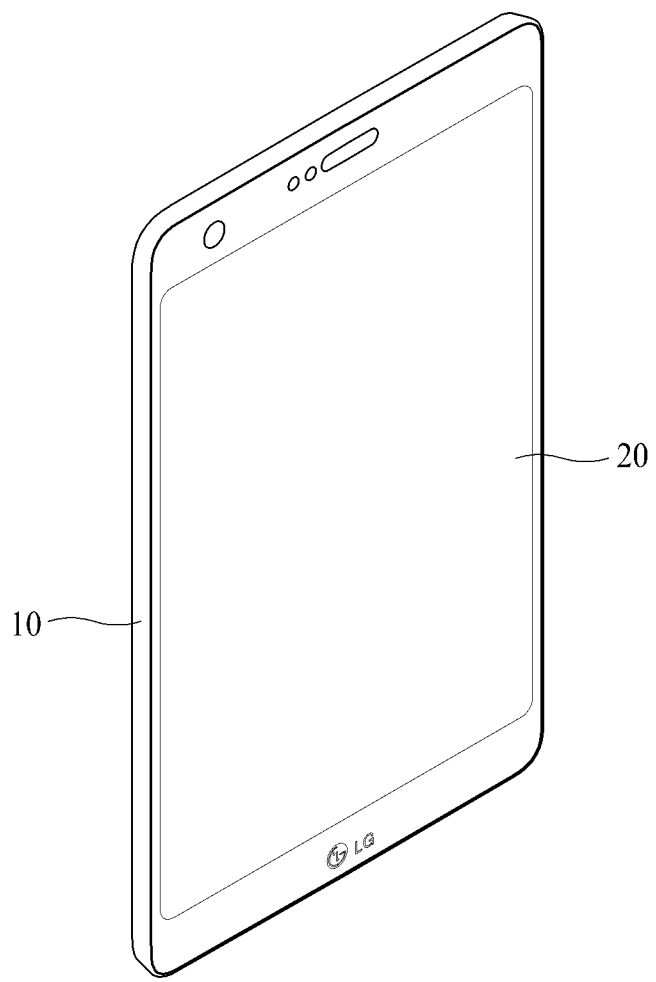
FIG. 1 is a perspective view illustrating a display apparatus according to one embodiment of the present application.

Reference will now be made in detail to embodiments of the present application, examples of which are illustrated in the accompanying drawings. Wherever possible, the same reference numbers will be used throughout the drawings to refer to the same or like parts. Advantages and features of the present application, and implementation methods thereof will be clarified through following embodiments described with reference to the accompanying drawings. The present application may, however, be embodied in different forms and should not be construed as limited to the embodiments set forth herein. Rather, these embodiments are provided so that this disclosure will be thorough and complete, and will fully convey the scope of the present application to those skilled in the art. Further, the present application is only defined by scopes of claims.

A shape, a size, a ratio, an angle, and a number disclosed in the drawings for describing embodiments of the present application are merely an example, and thus, the present application is not limited to the illustrated details. Like reference numerals refer to like elements throughout. In the following description, when the detailed description of the relevant known function or configuration is determined to unnecessarily obscure the important point of the present application, the detailed description will be omitted.

In a case where "comprise," "have," and "include" described in the present specification are used, another part may be added unless "only~" is used. The terms of a singular form may include plural forms unless referred to the contrary.

In construing an element, the element is construed as including an error region although there is no explicit description.

In describing a position relationship, for example, when the positional order is described as "on~," "above~," "below~," and "next~," a case which is not contact may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present application.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present application may be partially or overall coupled to or combined with each other, and may be variously inter-operated with each other and driven technically as those skilled in the art can sufficiently understand. The embodiments of the present application may be carried out independently from each other, or may be carried out together in co-dependent relationship.

Hereinafter, a display apparatus according to the embodiment of the present application will be described in detail with reference to the accompanying drawings.

FIG. 1 is a perspective view illustrating the display apparatus according to one embodiment of the present application.

With reference to FIG. 1, the display apparatus according to one embodiment of the present application may include a system housing 10 having an accommodation space, and a display module 20 accommodated in the accommodation space of the system housing 10.

The system housing 10 corresponds to a structure disposed in the outermost rear and lateral sides of the display apparatus, which may be referred to as a system enclosure.

The display module 20 may include a cover window supported on the system housing 10, and a display panel disposed in a rear surface of the cover window. When the cover window is connected with the system housing 10, the display panel may be supported by the cover window, thereby protecting the display panel from an external shock, and covering a non-display area of the display panel.

The display panel may be attached to the rear surface of the cover window, wherein an image is displayed on the display panel. The display panel according to one embodiment of the present application may be a liquid crystal display panel or organic light emitting display panel. If the display panel corresponds to the liquid crystal display panel, the display module 20 may further include a backlight unit disposed in a rear surface of the display panel. The display apparatus according to one embodiment of the present application may be a smart phone, a mobile communication terminal, a mobile phone, a tablet personal computer (PC), a smart watch, a watch phone, or a wearable device.

Figure 2:
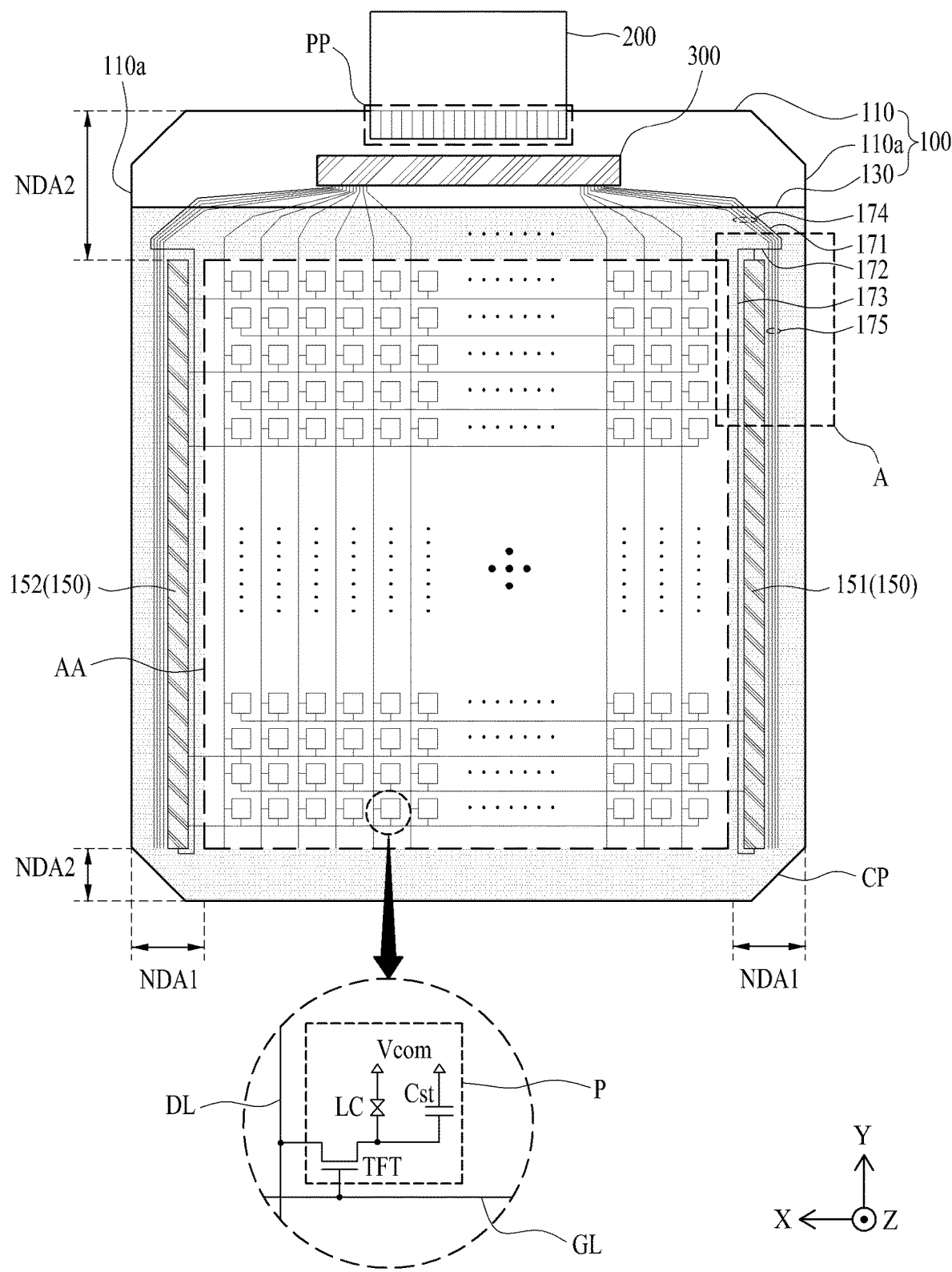
FIG. 2 illustrates the display apparatus according to one embodiment of the present application.

FIG. 2 roughly illustrates the display apparatus according to one embodiment of the present application.

As shown in FIG. 2, the display apparatus according to one embodiment of the present application may include a display panel 100, a gate driving built-in circuit 150, and a driving integrated circuit 300.

The display panel 100 corresponds to a liquid crystal display panel for displaying an image through liquid crystal molecules. The display panel 100 may include lower and upper substrates 110 and 130 bonded to each other with a liquid crystal layer interposed in-between. A predetermined image is displayed on the display panel 100 by the use of light emitted from a backlight unit.

The lower substrate 110 is generally formed of a glass material, but the lower substrate 110 is not limited thereto. The lower substrate 110 may be formed of a flexible or bendable transparent plastic material, for example, a polyimide material. The lower substrate 110 may be a thin film transistor array substrate, wherein the lower substrate 110 may include a display area (AA) and a non-display area.

The display area (AA) may be defined as the remaining area except the edges of the lower substrate 110. The display area (AA) may be defined as a pixel array area for displaying an image. The display area (AA) may include a plurality of sub pixels (P) formed in respective pixel regions prepared by a plurality of gate lines (GL) and data lines (DL).

The plurality of gate lines (GL) are prepared on the lower substrate 110, wherein each gate line (GL) extends in a first direction (X) of the lower substrate 110, and the plurality of gate lines (GL) are provided at fixed intervals along a second direction (Y) of the lower substrate 110. The first direction (X) may be parallel to a short side direction of the lower substrate 110, and the second direction (Y) may be parallel to a long side direction of the lower substrate 110, but not limited to this structure. The opposite case is also possible. For example, the first direction (X) may be parallel to a length direction of the gate line (GL), and the second direction (Y) may be parallel to a length direction of the data line (DL).

Each of the plurality of sub pixels (P) may be defined as a minimum unit area for transmitting virtual light therethrough. At least three of the adjacent sub pixels (P) may constitute a unit pixel for expressing a color display. For example, each one unit pixel may include adjacent red, green, and blue sub pixels. For improvement of luminance, each one unit pixel may further include a white sub pixel.

Each of the plurality of sub pixels (P) may include a thin film transistor (TFT) connected with the adjacent gate and data lines (GL, DL), a plurality of pixel electrodes connected with the thin film transistor (TFT), and a plurality of common electrodes prepared between each of the plurality of pixel electrodes. An image is displayed on each of the plurality of sub pixels (P) in accordance with a gate signal supplied from the adjacent gate line (GL) and a data voltage supplied from the adjacent data line (DL).

The non-display area is prepared in the edge of the lower substrate 110, thereby surrounding the display area (AA). The non-display area according to one embodiment of the present application may include a first non-display area (NDA1) and a second non-display area (NDA2).

The first non-display area (NDA1) and the second non-display area (NDA2) correspond to the peripheral area of the display area (AA). Unlike the display area (AA), an image is not displayed on the first non-display area (NDA1) and the second non-display area (NDA2). The first non-display area (NDA1) and the second non-display area (NDA2) may be defined as the area of lines and circuits for driving the pixel array.

The first non-display area (NDA1) may be defined as the left and right sides of the lower substrate 110 surrounding the left and right sides of the display area (AA). The gate driving built-in circuit 150 is disposed in the first non-display area (NDA1).

The second non-display area (NDA2) may be defined as the lower and upper sides of the lower substrate 110 so as to surround the lower and upper sides of the display area (AA). Herein, a pad portion (PP) and the driving integrated circuit 300 are disposed in the second non-display area (NDA2) defined in the upper side portion of the lower substrate 110.

The pad portion (PP) may be connected with an external driving circuit film 200, wherein the pad portion (PP) receives a ground voltage, driving power and various signals supplied from the driving circuit film 200, and transmits the received ground voltage, driving power and various signals to the driving integrated circuit 300. Herein, some of the signals and power may be directly supplied to the gate driving built-in circuit 150 without passing through the driving integrated circuit 300.

The upper substrate 130 corresponds to a color filter array substrate, wherein a size of the upper substrate 130 is smaller than a size of the lower substrate 110. The upper substrate 130 is formed of a glass or plastic material. The lower and upper substrates 110 and 130 may be formed of the same material. The upper substrate 130 may include a black matrix, a color filter layer, and an overcoat layer.

The black matrix defines an opening area for each of the plurality of sub pixels (P) on the lower substrate 110. The black matrix is prepared on the upper substrate 130, wherein the black matrix is overlapped with the remaining area of the lower substrate 110 except the plurality of opening areas overlapped with a plurality of pixels, for example, the non-display area, the gate lines, the data lines, and the thin film transistors (TFT) of the lower substrate 110. The black matrix prevents light from leaking in the remaining area except the plurality of opening areas, and absorbs ambient light.

The color filter layer is provided in each of the plurality of opening areas defined by the black matrix. The color filter layer may include respective red, green, and blue color filters in accordance with a preset color for each sub pixel (P). The overcoat layer covers the black matrix and the color filter layer, thereby providing a flat surface on the black matrix and the color filter layer.

The lower and upper substrates 110 and 130 are bonded to each other with the liquid crystal layer interposed in-between by the use of sealant. Accordingly, the respective sub pixels (P) confront each other with the liquid crystal layer interposed in-between so that each liquid crystal cell (LC) is formed between the pixel and common electrodes. The liquid crystal cell (LC) controls a light transmittance through the use of liquid crystal molecules driven in accordance with an electric field formed by a data voltage supplied to the pixel electrode and a common voltage supplied to the common electrode. Each of the plurality of sub pixels (P) includes a storage capacitor (Cst) prepared in an overlap area between the pixel and common electrodes. The storage capacitor (Cst) stores a differential voltage between the data voltage supplied to the pixel electrode and the common voltage supplied to the common electrode. If the thin film transistor (TFT) is turned-off, the voltage stored until the thin film transistor (TFT) is turned-on again is supplied to the pixel electrode.

The gate driving built-in circuit 150 is integrated (or provided) on the first non-display area (NDA1) of the lower substrate 110 for a process of forming the thin film transistor (TFT), and is connected with the plurality of gate lines (GL) in one-to-one correspondence. The gate driving built-in circuit 150 generates gate signals based on a plurality of gate shift clocks and a gate start signal provided from the driving integrated circuit 300, and outputs the generated gate signals in accordance with a preset order, to thereby switch the thin film transistor (TFT) of the sub pixel (P) connected with each of the plurality of gate lines (GL). The gate driving built-in circuit 150 may include a shift register.

The driving integrated circuit 300 may be mounted on a chip mounting area defined in the second non-display area (NDA2) of the lower substrate 100 for a chip bonding process carried out after a substrate bonding process. The driving integrated circuit 300 receives driving power, ground voltage, timing synchronization signal, and digital video data provided from the external via the pad portion (PP) and driving circuit film 200. The driving integrated circuit 300 converts the digital video data into analog data voltages, and supplies the analog data voltages to the plurality of data lines (DL). The driving integrated circuit 300 generates the plurality of gate shift clocks and the gate start signal in accordance with the timing synchronization signal, and controls the driving of the gate driving built-in circuit 150.

The gate start signal may be applied to the gate driving built-in circuit 150 through a first gate link line 171, a connection line 172, and a gate start signal line 173. The plurality of gate shift clocks may be applied to the gate driving built-in circuit 150 through a plurality of second gate link lines 174 and a plurality of gate shift clock lines 175.

One end in each of the first gate link line 171 and the plurality of second gate link lines 174 may be prepared in the second display area (NDA2), and may be electrically connected with a corresponding output channel of the driving integrated circuit 300. In this case, the first gate link line 171 may be slantly disposed between the connection line 172 and the corresponding output channel of the driving integrated circuit 300, or may be disposed in a step-shaped type according to a corner shape of the lower substrate 110.

The connection line 172 may be prepared in the first non-display area (NDA1) or the second non-display area (NDA2). The connection line 172 electrically connects the first gate link line 171 and the gate start signal line 173 with each other through the plurality of gate shift clock lines 175. The connection line 172 is provided at the different layer from those of the plurality of gate shift clock lines 175 and the gate start signal line 173. For example, the connection line 172 may be prepared above or below the plurality of gate shift clock lines 175 while being crossed with the plurality of gate shift clock lines 175.

The gate start signal line 173 may be disposed closer to the display area (AA) in comparison to the plurality of gate shift clock lines 175. The gate start signal line 173 according to one embodiment of the present application may be prepared in the first non-display area (NDA1) between the display area (AA) and the gate driving built-in circuit 150 while being parallel to the second direction (Y).

Each of the plurality of gate shift clock lines 175 may be electrically connected with the other end in each of the plurality of second gate link lines 174. That is, each of the plurality of gate shift clock lines 175 extends from the other end in each of the plurality of second gate link lines 174 along the second direction (Y), wherein each of the plurality of gate shift clock lines 175 is prepared on the first non-display area (NDA1). The plurality of gate shift clock lines 175 may be farther away from the display area (AA) in comparison to the gate start signal line 173. The plurality of gate shift clock lines 175 according to one embodiment of the present application may be prepared on the first non-display area (NDA1) between the gate driving built-in circuit 150 and an outer sidewall 110a of the lower substrate 110.

Each corner portion (CP) of the display panel 100 according to one embodiment of the present application may have a non-quadrangle shape. For example, each corner portion (CP) of the display panel 100 may have a sloped or curved shape by a chamfering process. When each corner portion (CP) of the display panel 100 has the non-quadrangle shape instead of a quadrangle shape, a good design in the display apparatus can be realized.

Figure 3:
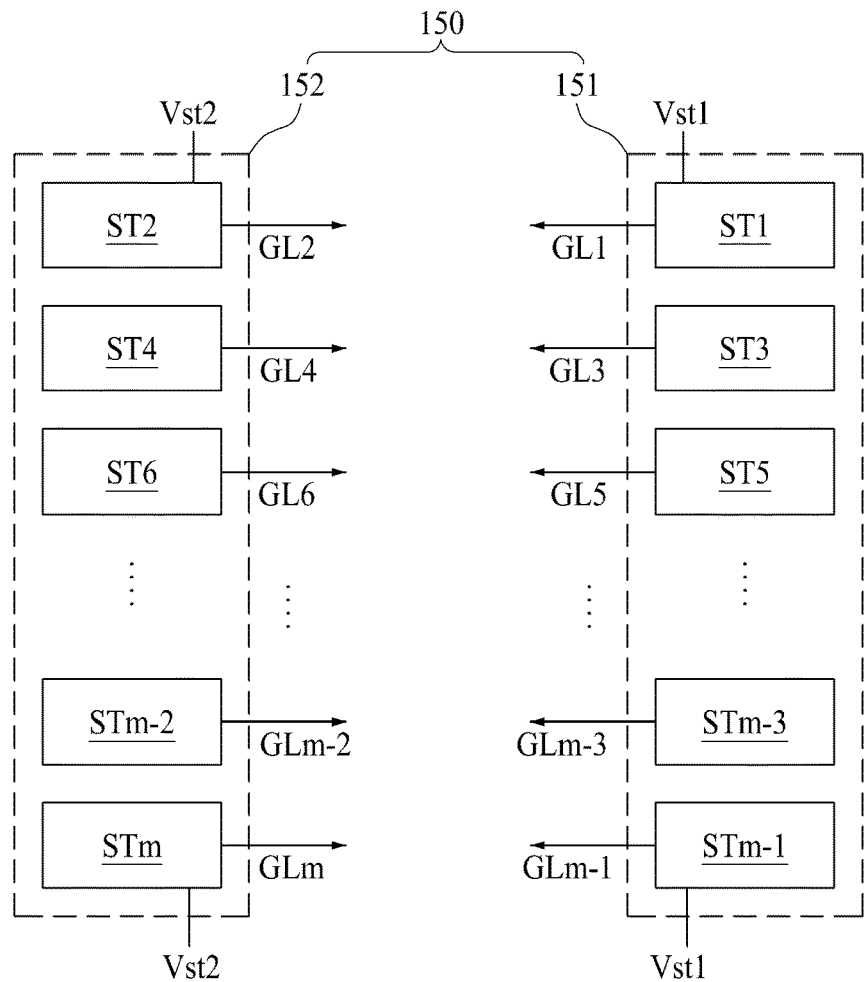
FIG. 3 is a block diagram illustrating a structure of a gate driving built-in circuit shown in FIG. 2.

FIG. 3 is a block diagram illustrating a structure of the gate driving built-in circuit shown in FIG. 2.

With reference to FIGS. 2 and 3, the gate driving built-in circuit 150 according to one embodiment of the present application may sequentially drive the 'm' gate lines (GL1~GLm) in accordance to a forward or reverse interlace driving mode based on a single feeding method. The gate driving built-in circuit 150 according to example embodiments of the present application may be enabled (or operated) by first and second gate start signals (Vst1, Vst2) supplied from the driving integrated circuit 300, whereby the gate driving built-in circuit 150 may sequentially supply the corresponding gate shift clock selected among the plurality of gate shift clocks supplied from the driving integrated circuit 300 to the first gate line (GL1) to the m-th gate line (GLm), or may sequentially supply the corresponding gate shift clock from the m-th gate line (GLm) to the first gate line (GL1). In this case, the gate shift clock supplied to each gate line may be used as the gate signal or scan signal having a gate-on voltage level so as to turn on the thin film transistor prepared in each sub pixel. For the following description of the present application, it is assumed that the gate driving built-in circuit 150 outputs the corresponding gate shift clock selected among the first to eighth gate shift clocks as the gate signal.

The gate driving built-in circuit 150 according to an example embodiment of the present application may include first and second gate driving built-in circuits 151 and 152 prepared in the first non-display area (NDA1). That is, the gate driving built-in circuit 150 may include the first gate driving built-in circuit 151 disposed in the first non-display area (NDA1) prepared at one side of the lower substrate 110, and the second gate driving built-in circuit 152 disposed in the first non-display area (NDA1) prepared at the other side of the lower substrate 110.

The first gate driving built-in circuit 151 may be enabled (or operated) by the first gate start signal (Vst1) supplied through the first gate start signal line, whereby the first gate driving built-in circuit 151 may sequentially supply the plurality of first gate shift clocks, which are supplied through the plurality of first gate shift clock lines, to the odd-numbered gate lines. Herein, the plurality of first gate shift clocks may be the odd-numbered gate shift clocks among the first to eighth gate shift clocks. The first gate start signal line may be disposed closer to the display area in comparison to the first gate shift clock line so that it is possible to protect the first gate start signal line from static electricity. That is, the first gate start signal line may be disposed between the first gate driving built-in circuit 151 and the display area.

The second gate driving built-in circuit 152 may be enabled (or operated) by the second gate start signal (Vst2) supplied through the second gate start signal line, whereby the second gate driving built-in circuit 152 may sequentially supply the plurality of second gate shift clocks, which are supplied through the plurality of second gate shift clock lines, to the even-numbered gate lines. Herein, the plurality of second gate shift clocks may be the even-numbered gate shift clocks among the first to eighth gate shift clocks. The second gate start signal line may be disposed closer to the display area in comparison to the second gate shift clock line so that it is possible to protect the second gate start signal line from static electricity. That is, the second gate start signal line may be disposed between the second gate driving built-in circuit 152 and the display area.

The gate driving built-in circuit 150 may include first to m-th stages (ST1~STm). The odd-numbered stages (ST1, ST3, ST5~STm−3, STm−1) among the first to m-th stages (ST1~STm) constitute the first gate driving built-in circuit 151. The even-numbered stages (ST2, ST4, ST6~STm−2, STm) among the first to m-th stages (ST1~STm) constitute the second gate driving built-in circuit 152. Among the stages (ST1, ST3, ST5~STm−3, STm−1) of the first gate driving built-in circuit 151, at least one stage adjacent to the second non-display area may be disposed in the step-shaped type according to the corner shape of the lower substrate 110. In the same manner, among the stages (ST2, ST4, ST6~STm−2, STm) of the second gate driving built-in circuit 152, at least one stage adjacent to the second non-display area may be disposed in the step-shaped type according to the corner shape of the lower substrate 110.

For the forward interlace driving mode, the first stage (ST1) disposed in the first gate driving built-in circuit 151 may be enabled in accordance with the first gate start signal (Vst1), whereby the first stage (ST1) may output the first gate shift clock, and may be reset in accordance with the output signal of the third stage (ST3). Also, the remaining odd-numbered stages (ST3, ST5~STm−3) except the first stage and the (m−1)th stage (ST1, STm−1) disposed in the first gate driving built-in circuit 151 may be enabled in accordance with the output signal of the prior odd-numbered stage, whereby each of the remaining odd-numbered stages may output the corresponding gate shift clock, and may be reset in accordance with the output signal of the next odd-numbered stage. The (m−1)th stage (STm−1) disposed in the first gate driving built-in circuit 151 may be enabled in accordance with the output signal of the (m−3)th stage (STm−3), whereby the (m−1)th stage (STm−1) may output the corresponding gate shift clock, and may be reset in accordance with the first gate start signal (Vst1).

For the forward interlace driving mode, the second stage (ST2) disposed in the second gate driving built-in circuit 152 may be enabled in accordance with the second gate start signal (Vst2), whereby the second stage (ST2) may output the fourth gate shift clock, and may be reset in accordance with the output signal of the fourth stage (ST4). Also, the remaining even-numbered stages (ST4, ST6~STm) except the second stage and the m-th stage (ST2, STm) disposed in the second gate driving built-in circuit 152 may be enabled in accordance with the output signal of the prior even-numbered stage, whereby each of the remaining even-numbered stages may output the corresponding gate shift clock, and may be reset in accordance with the output signal of the next even-numbered stage. The (m)th stage (STm) disposed in the second gate driving built-in circuit 152 may be enabled in accordance with the output signal of the (m−2)th stage (STm−2), whereby the m-th stage (STm) may output the corresponding gate shift clock, and may be reset in accordance with the second gate start signal (Vst2).

For the reverse interlace driving mode, the (m−1)th stage (STm−1) disposed in the first gate driving built-in circuit 151 may be enabled in accordance with the first gate start signal (Vst1), whereby the (m−1)th stage (STm−1) may output the corresponding gate shift clock, and may be reset in accordance with the output signal of the (m−3)th stage (STm−3). Also, the remaining odd-numbered stages (STm−3~ST5, ST3) except the (m−1)th stage and the first stage (STm−1, ST1) disposed in the first gate driving built-in circuit 151 may be enabled in accordance with the output signal of the next odd-numbered stage, whereby each of the remaining odd-numbered stages may output the corresponding gate shift clock, and may be reset in accordance with the output signal of the prior odd-numbered stage. The first stage (ST1) disposed in the first gate driving built-in circuit 151 may be enabled in accordance with the output signal of the third stage (ST3), whereby the first stage (ST1) may output the first gate shift clock, and may be reset in accordance with the first gate start signal (Vst1).

For the reverse interlace driving mode, the m-th stage (STm) disposed in the second gate driving built-in circuit 152 may be enabled in accordance with the second gate start signal (Vst2), whereby the m-th stage (STm) may output the corresponding gate shift clock, and may be reset in accordance with the output signal of the (m−2)th stage (STm−2). Also, the remaining even-numbered stages (STm−2~ST6, ST4) except the m-th stage and the second stage (STm, ST2) disposed in the second gate driving built-in circuit 152 may be enabled in accordance with the output signal of the next even-numbered stage, whereby each of the remaining odd-numbered stages may output the corresponding gate shift clock, and may be reset in accordance with the output signal of the prior even-numbered stage. The second stage (ST2) disposed in the second gate driving built-in circuit 152 may be enabled in accordance with the output signal of the fourth stage (ST4), whereby the second stage (ST2) may output the fourth gate shift clock, and may be reset in accordance with the second gate start signal (Vst2).

Figure 4:
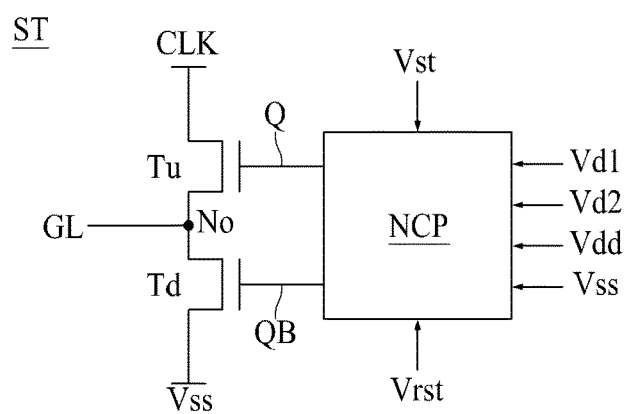
FIG. 4 illustrates one stage shown in FIG. 3.

FIG. 4 illustrates one stage shown in FIG. 3. As shown in FIG. 4, the stage (ST) according to one embodiment of the present application may include a node control portion (NCP), a pull-up transistor (Tu), and a pull-down transistor (Td).

The node control portion (NCP) controls a voltage in each of first and second nodes (Q, QB) on the basis of gate start signal (Vst, or output signal of the prior stage), reset signal (Vrst, or output signal of the next stage), forward driving voltage (Vd1), and reverse driving voltage (Vd2). Herein, the forward driving voltage (Vd1) has a high-potential voltage level or low-potential voltage level in response to a rotation state of the display panel (image displaying direction). The reverse driving voltage (Vd2) has any one of the high-potential voltage level and the low-potential voltage level, wherein the voltage level of the reverse driving voltage (Vd2) is different from the voltage level of the forward driving voltage (Vd1). For example, for the forward interlace driving mode, the forward driving voltage (Vd1) has the high-potential voltage level, and the reverse driving voltage (Vd2) has the low-potential voltage level. On the contrary, for the reverse interlace driving mode, the forward driving voltage (Vd1) has the low-potential voltage level, and the reverse driving voltage (Vd2) has the high-potential voltage level.

The node control portion (NCP) according to one embodiment of the present application charges the first node (Q) with the forward driving voltage (Vd1) in accordance with the gate start signal (Vst), or charges the first node (Q) with the reverse driving voltage (Vd2) in accordance with the reset signal (Vrst). For example, for the forward interlace driving mode, the node control portion (NCP) supplies the forward driving voltage (Vd1) of the high-potential voltage level to the first node (Q) in accordance with the gate start signal (Vst) of the gate-on voltage level, and discharges the voltage of the second node (QB) to reset power source (Vss) in accordance with the voltage of the first node (Q). For the reverse interlace driving mode, the node control portion (NCP) supplies the reverse driving voltage (Vd2) of the high-potential voltage level to the first node (Q) in accordance with the reset signal (Vrst) of the gate-on voltage level, and discharges the voltage of the second node (QB) to the reset power source (Vss) in accordance with the voltage of the first node (Q).

When the pull-up transistor (Tu) is turned-on by the voltage of the first node (Q), the pull-up transistor (Tu) outputs the clock signal (CLK) having the gate-on voltage level, which serves as the gate signal, to the corresponding gate line (GL) through the output terminal (No), thereby turning on the thin film transistors connected with the corresponding gate line (GL). The pull-up transistor (Tu) may include a gate electrode connected with the first node (Q), a drain electrode connected with the gate shift clock line, and a source electrode connected with the output terminal (No). In this case, the source electrode and the drain electrode included in the pull-up transistor (Tu) may be changed in their positions in accordance with a current direction.

When the pull-down transistor (Td) is turned-on by the voltage of the second node (QB), the pull-down transistor (Td) discharges the voltage of the output terminal (No) to the reset power source (Vss), to thereby turn off the thin film transistors connected with the corresponding gate line (GL). The pull-down transistor (Td) according to one example embodiment of the present application may include a gate electrode connected with the second node (Q), a drain electrode connected with the output terminal (No), and a source electrode connected with the reset power source (Vss). In this case, the source electrode and the drain electrode included in the pull-down transistor (Td) may be changed in their positions in accordance with a current direction.

Figure 5:
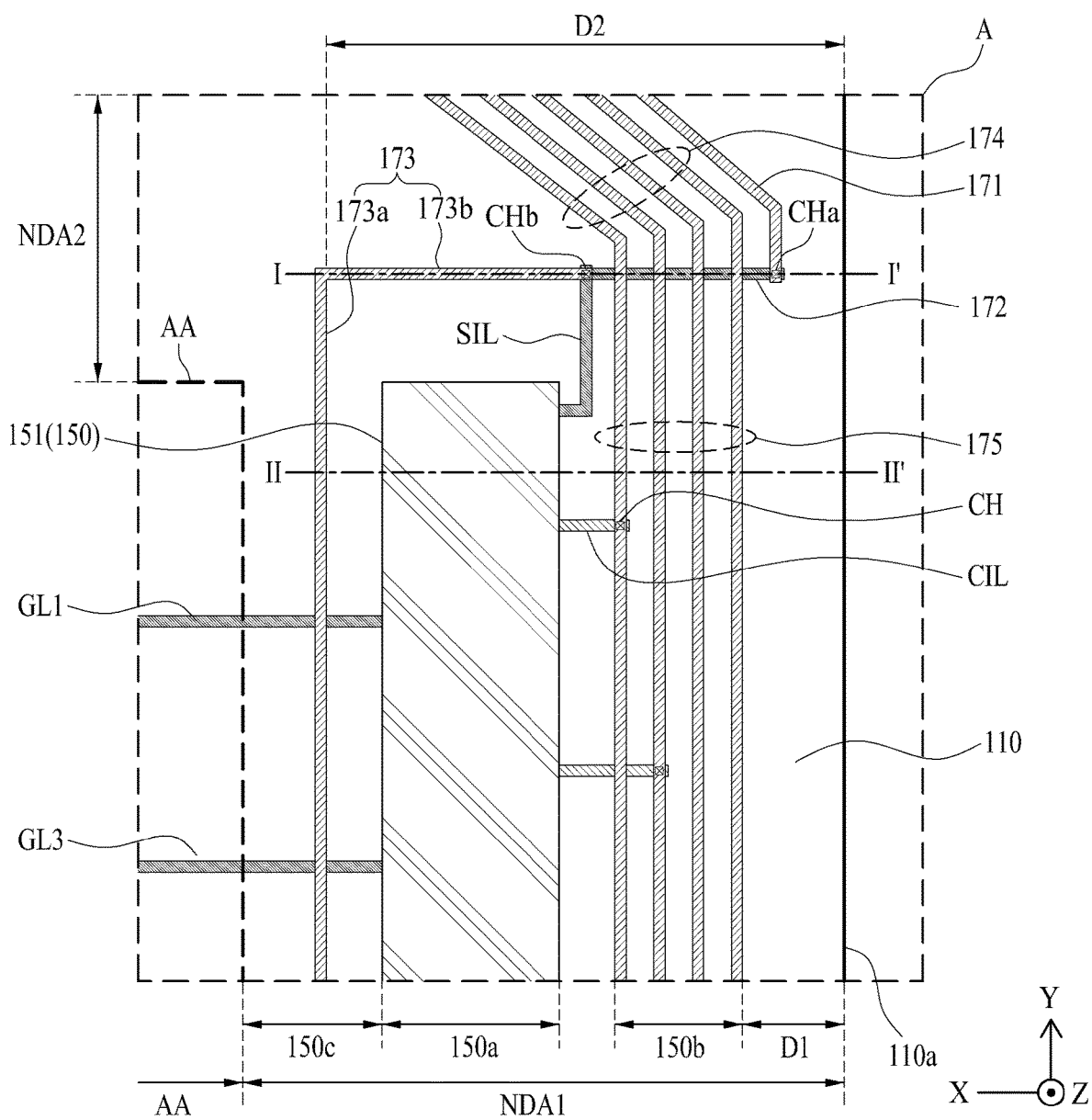
FIG. 5 is an expanded view illustrating portion 'A' of FIG. 2.
Figure 6:
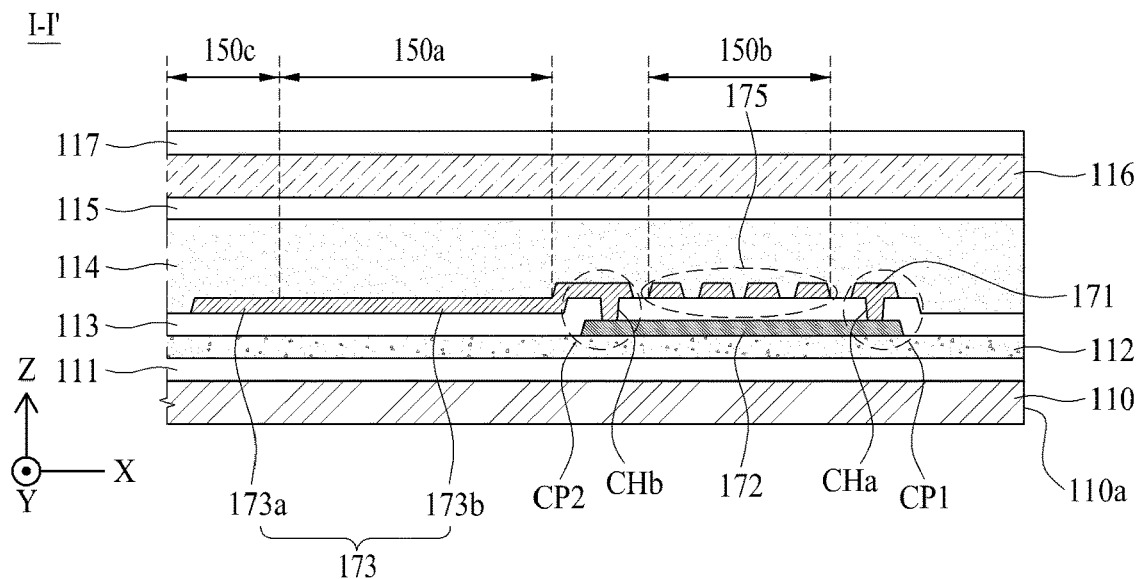
FIG. 6 is a cross sectional view along line I-I' of FIG. 5.
Figure 7:
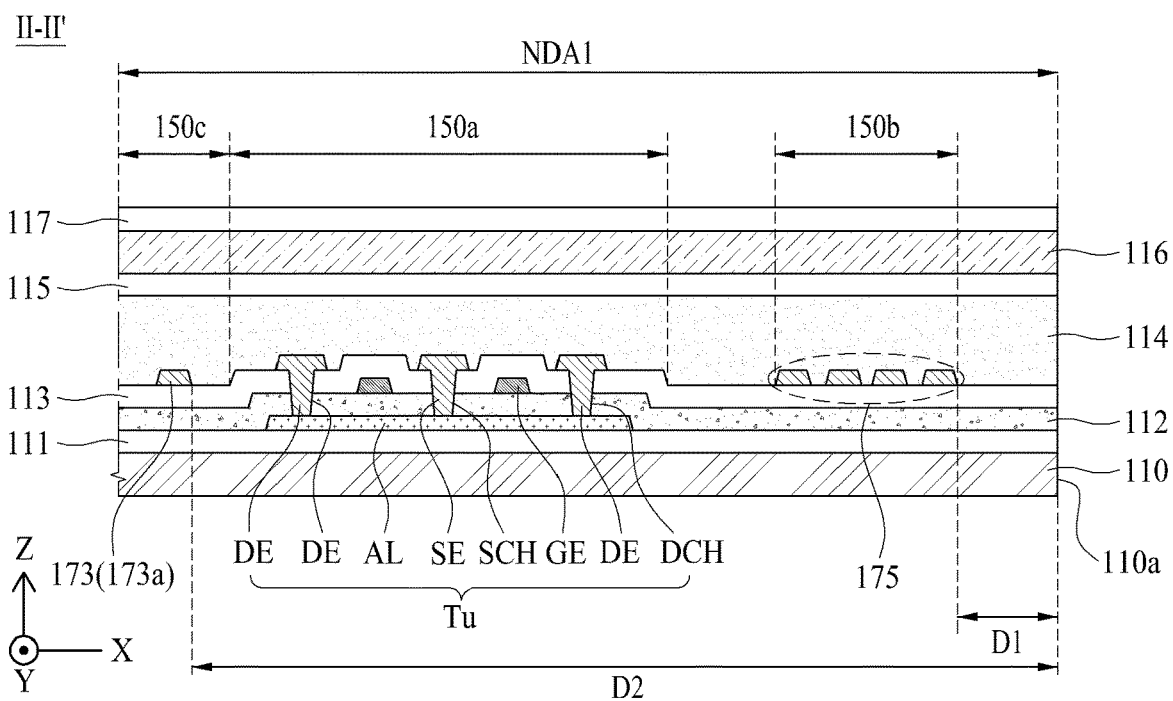
FIG. 7 is a cross sectional view along line of FIG. 5.

FIG. 5 is an expanded view illustrating portion 'A' of FIG. 2, FIG. 6 is a cross sectional view along line I-I' of FIG. 5, and FIG. 7 is a cross sectional view along line of FIG. 5, wherein FIGS. 5, 6, and 7 illustrate a line structure in the first non-display area of the lower substrate.

As shown in FIGS. 5 to 7 in combination with FIG. 2, the display apparatus according to example embodiments of the present application may include a circuit internal portion 150*a*, and first and second clock line portions 150*b* and 150*c* disposed in the first non-display area (NDA1) of the lower substrate 110. The circuit internal portion 150*a* may be disposed on the first non-display area (NDA1) between the display area (AA) and the outer sidewall 110*a* of the lower substrate 110. That is, the circuit internal portion 150*a* may be disposed between the first clock line portion 150*b* and the second clock line portion 150*c*. In the circuit internal portion 150*a*, the gate driving built-in circuit 150 may be provided as shown in FIGS. 3 and 4.

The pull-up transistor (Tu) of the thin film transistor for the node control portion of each stage prepared in the gate driving built-in circuit 150 may include an active layer (AL) prepared on the circuit internal portion 150*a* of the lower substrate 110, at least one gate electrode (GE), at least one drain electrode (DE), and at least one source electrode (SE). The active layer (AL) may be prepared in an island shape on the lower substrate 110, or may be prepared in an island shape on an upper surface of a buffer layer 111 coated onto an upper surface of the lower substrate 110.

The active layer (AL) may be formed of a semiconductor material, for example, low temperature poly-silicon, amorphous silicon, polycrystalline silicon, oxide or organic material, but not limited to these materials. The active layer (AL) may include at least one drain region, at least one source region, and a non-conductive channel region. The active layer (AL) is covered by a gate insulating film 112.

At least one gate electrode (GE) may be provided on the gate insulating film 112 while being overlapped with the channel region of the active layer (AL). At least one gate electrode (GE) is formed together with the gate lines on the display area (AA). The gate electrode according to one example embodiment of the present application may be formed in a single-layered structure or multi-layered structure of any one of molybdenum (Mo), aluminum (Al), chrome (Cr), gold (Au), titanium (Ti), nickel (Ni), neodymium (Nd), and copper (Cu), or their alloys, but not limited to these structures. At least one gate electrode (GE) may be covered by an insulating interlayer 113. The insulating interlayer 113 according to one embodiment of the present application may be formed of an insulating material, such as silicon oxide (SiOx), silicon nitride (SiNx), photo acryl or benzocyclobutene (BCB).

At least one drain electrode (DE) may be provided on the insulating interlayer 113 being overlapped with the drain region of the active layer (AL). At least one drain electrode (DE) is electrically connected with the drain region of the active layer (AL) through at least one drain contact hole (DCH) prepared in the insulating interlayer 113. At least one source electrode (SE) is provided on the insulating interlayer 113 being overlapped with the source region of the active layer (AL). At least one source electrode (SE) is electrically connected with the source region of the active layer (AL) through at least one source contact hole (SCH) prepared in the insulating interlayer 113. At least one drain electrode (DE) and at least one source electrode (SE) are formed together with the data lines on the display area (AA). At least one drain electrode (DE) and at least one source electrode (SE) may be formed in a single-layered structure or multi-layered structure of any one of molybdenum (Mo), aluminum (Al), chrome (Cr), gold (Au), titanium (Ti), nickel (Ni), neodymium (Nd), and copper (Cu), or their alloys, but not limited to these structures.

At least one drain electrode (DE) and at least one source electrode (SE) are covered by a protection film (or planarization layer) 114. The protection film 114 may be formed of an insulating material, such as silicon oxide (SiOx), silicon nitride (SiNx), photo acryl or benzocyclobutene (BCB). The protection film 114 may be covered by first to third insulating layers 115, 116, and 117 additionally provided in accordance with a structure of the sub pixel prepared in the display area (AA).

The first clock line portion 150*b* is disposed in the periphery of the first non-display area (NDA1). The first clock line portion 150*b* may be disposed on the first non-display area (NDA1) between the circuit internal portion 150*c* and the outer sidewall 110*a* of the lower substrate 110 with respect to the first direction (X). In this case, the first clock line portion 150*b* may be spaced from the outer sidewall 110*a* of the lower substrate 110 by a first distance (D1), thereby preventing introduction of static electricity generated in the vicinity of the display apparatus. For example, the first distance (D1) may be set to be in a range of 140 μm≤D1≤150 μm.

The first clock line portion 150*b* may include a plurality of gate shift clock lines 175. The plurality of gate shift clock lines 175 may be provided in the first clock line portion 150*b*, wherein the plurality of gate shift clock lines 175 may be disposed at fixed intervals along the first direction (X) while being parallel to the second direction (Y). One end in each of the plurality of gate shift clock lines 175 may be connected with each of the plurality of second gate link lines 174 prepared in the second non-display area (NDA2) of the lower substrate 110 in one-to-one correspondence, whereby each of the plurality of gate shift clock lines 175 may be electrically connected with the gate clock output channel of the driving integrated circuit 300 through each of the plurality of second gate link lines 174. The plurality of gate shift clock lines 175 according to one example embodiment of the present application may be disposed on the insulating interlayer 113, may be formed of the same material as that of the data line (DL), and may be covered by the protection film 114.

The minimum distance (D1, or first distance) between the outer sidewall 110*a* of the lower substrate 110 and the outermost gate shift clock line among the plurality of gate shift clock lines 175 may be set to be in a range of 140 μm≤D1≤150 μm. Herein, if the first distance (D1) is less than 140 μm, static electricity generated in the vicinity of the display apparatus may be introduced into the inside of the display apparatus, whereby the transistor of the gate driving built-in circuit 150 connected with the gate shift clock line may be damaged or operated incorrectly. If the first distance (D1) is more than 150 μm, the introduction of static electricity can be prevented. However, a width of the first non-display area (NDA1) is increased due to the increased distance, whereby a bezel width is also increased. For example, the first distance (D1) may be set in a range of 140

μm≤D1≤150 μm to prevent the introduction of static electricity without the increasing bezel width in the display apparatus.

A distance between each of the plurality of gate shift clock lines 175 may be the same as or more than 5 μm, and may be the same as or less than 10 μm. In this case, if the distance between each of the plurality of gate shift clock lines 175 is less than 5 μm, a short may occur between each line. Meanwhile, if the distance between each of the plurality of gate shift clock lines 175 is more than 10 μm, it is possible to prevent the short between each line. However, the first non-display area (NDA1) is increased in its width to secure the first distance (D1), whereby it causes the increase of bezel width. For example, the distance between each of the gate shift clock lines 175 is set to be the same as or more than 5 and be the same as or less than 10 μm to prevent a short between each line and to secure the first distance (D1).

Each of the plurality of gate shift clock lines 175 may be connected with the drain electrode of the pull-up transistor (Tu) prepared in the corresponding stage through a clock input line (CIL). The clock input line (CIL) may be prepared in the first direction (X) so as to cross the corresponding gate shift clock line 175, and may be electrically connected with the corresponding gate shift clock line 175 through a clock line contact hole (CH). For example, the clock input line (CIL) may be a jumping line that is formed in the different layer from that of the gate shift clock line 175 and is provided to electrically connect the corresponding gate shift clock line 175 and the drain electrode of the pull-up transistor (Tu) with each other.

Each of the plurality of second gate link lines 174 is disposed in the second non-display area (NDA2) of the lower substrate 110, thereby connecting each of the plurality of gate shift clock lines 175 and each of the gate clock output channels of the driving integrated circuit 300 with each other in one-to-one correspondence. Each of the second gate link lines 174 may be slantly disposed between the gate clock output channel of the driving integrated circuit 300 and one side of each of the plurality of gate shift clock lines 175, or may be disposed in a step-shaped type according to a corner shape of the lower substrate 110. Each of the second gate link lines 174 together with each of the plurality of gate shift clock lines 175 may be disposed on the insulating interlayer 113, and may be covered by the protection film 114.

Each of the plurality of gate shift clock lines 175 provided in the first clock line portion 150b is disposed adjacent to the outer sidewall 110a of the lower substrate 110, whereby static electricity might be introduced thereto. In this case, the static electricity introduced to the first clock line portion 150b may be transmitted to and dissipated in the plurality of stages disposed in the gate driving built-in circuit 150 to prevent the transistors of the stages connected with the first clock line portion 150b from being damaged or operated incorrectly by the static electricity.

The second clock line portion 150c is disposed between the first clock line portion 150b and the display area (AA) of the lower substrate 110 with respect to the first direction (X). That is, the second clock line portion 150c may be disposed on the first non-display area (NDA1) between the circuit internal portion 150c and the display area (AA) of the lower substrate 110. The second clock line portion 150c is disposed closer to the display area (AA) in comparison to the first clock line portion 150b, to thereby prevent the introduction of static electricity generated in the vicinity of the display apparatus. The second clock line portion 150c according to one embodiment of the present application may be spaced apart from the outer sidewall 110a of the lower substrate 110 by a second distance (D2), wherein the second distance (D2) may be longer than the first distance (D1). For example, the second distance (D2) may be set to be in a range of 600 μm≤D2≤700 μm, but not limited to this range. The second distance (D2) may be changed in accordance with a width of the circuit internal portion 150c.

The second clock line portion 150c may include the gate start signal line 173. The gate start signal line 173 may be formed of the same material as that of the data line (DL), may be disposed on the insulating interlayer 113, and may be covered by the protection film 114.

The gate start signal line 173 may be disposed between the display area (AA) and the circuit internal portion 150c. One side of the gate start signal line 173 may be electrically connected with the gate start signal output channel of the driving integrated circuit 300 through the connection line 172 and the first gate link line 171, and the other side of the gate start signal line 173 may be electrically connected with the node control portion prepared in the last stage of the gate driving built-in circuit 150 through the start signal input line. The gate start signal line 173 is spaced apart from the outer sidewall 110a of the lower substrate 110 by the second distance (D2), thereby preventing the introduction of static electricity.

The gate start signal line 173 may include a first line 173a disposed between the display area (AA) and the circuit internal portion 150c, and a second line 173b bent from an end of the first line 173a and electrically connected with the connection line 172. For example, the gate start signal line 173 may have a ¬-shaped plane structure (bent shape) that makes a detour around the gate driving built-in circuit 150. When the first line 173a is spaced apart from the outer sidewall 110a of the lower substrate 110 by the second distance (D2), the introduction of static electricity can be prevented. The second line 173b may be provided to electrically connect the first line 173a and the connection line 172 with each other, and may be disposed in the second non-display area (NDA2). Herein, one side of the first line 173a connected with the second line 173b may be disposed linearly or disposed in a step shape according to the position of stages for the gate driving built-in circuit. The second line 173b can be omitted. In this case, the first line 173a may be directly connected with the connection line 172 through the use of contact portion.

The connection line 172 makes a detour around the plurality of gate shift clock lines 175 and the gate driving built-in circuit 150, whereby the first gate link line 171 and the gate start signal line 173 are electrically connected with each other through the connection line 172. The connection line 172 according to an example embodiment may be disposed on the second non-display area (NDA2) along the first direction (X) to cross the plurality of gate shift clock lines 175, whereby the first gate link line 171 is electrically connected with the gate start signal line 173 through the connection line 172.

The connection line 172 may be provided in an island shape on the gate insulating film 112 while being crossed and overlapped with the plurality of gate shift clock lines 175. That is, under the condition that the insulating interlayer 113 is disposed between the connection line 172 and the plurality of gate shift clock lines 175, the connection line 172 is disposed below the plurality of gate shift clock lines 175.

One edge of the connection line 172 according to one embodiment of the present application may be electrically connected with the first gate link line 171 disposed on the insulating interlayer 113 through a first contact hole (CHa)

formed in a first contact portion (CP1) overlapped with the first gate link line 171. The other edge of the connection line 172 according to one embodiment of the present application may be electrically connected with the second line 173b of the gate start signal line 173 through a second contact portion (CP2). In this case, the first contact hole (CHa) together with source and drain contact holes (SCH, DCH) may be provided in the insulating interlayer 113.

The other edge of the connection line 172 may be directly connected with one side of the gate start signal line 173 disposed on the insulating interlayer 113 through a second contact hole (CHb) provided in the second contact portion (CP2) overlapped with one side of the gate start signal line 173. In this case, the other edge of the connection line 172 may be overlapped with one side of the gate start signal line 173. Herein, the second contact hole (CHb) together with the source and drain contact holes (SCH, DCH) may be provided in the insulating interlayer 113.

The connection line 172 may be electrically connected with the node control portion prepared in the first stage of the gate driving built-in circuit 150 through the start signal input line (SIL). The start signal input line (SIL) may be electrically connected with the connection line 172 in the second contact portion (CP2). Selectively, as shown in FIG. 5, the start signal input line (SIL) may be electrically connected with the first line 173a or second line 173b of the gate start signal line 173 through a third contact portion instead of being directly connected with the connection line 172. The start signal input line (SIL) and the connection line 172 may be disposed in the same layer.

The first gate link line 171 may be disposed on the insulating interlayer 113 overlapped with the second non-display area (NDA2) between the outer sidewall 110a of the lower substrate 110 and the plurality of second gate link lines 174. One side of the first gate link line 171 is electrically connected with the gate start signal output channel of the driving integrated circuit 300, and the other side of the first gate link line 171 is electrically connected with one edge of the connection line 172 through the first contact portion (CP1). The first gate link line 171 may include an inclined portion prepared between the gate start signal output channel of the driving integrated circuit 300 and one edge of the connection line 172. The first gate link line 171 is disposed relatively adjacent to the outer sidewall 110a of the lower substrate 110 in accordance with a channel pin map of the driving integrated circuit 300. However, as the remaining portion of the first gate link line 171 except the other edge of the first gate link line 171 connected with one edge of the connection line 172 becomes closer to the gate start signal output channel of the driving integrated circuit 300, the remaining portion of the first gate link line 171 becomes gradually spaced from the outer sidewall 110a of the lower substrate 110 due to the inclined portion of the first gate link line 171, thereby preventing the introduction of static electricity. The other edge of the connection line 172 being adjacent to the outer sidewall 110a of the lower substrate 110 has a relatively short length so that it is possible minimize or at least reduce the introduction of static electricity.

In the display apparatus, the gate start signal line 173 may be disposed closer to the display area (AA) in comparison to the plurality of gate shift clock lines 175, that is, the gate start signal line 173 is disposed between the display area (AA) and the gate driving built-in circuit 150 to prevent the static electricity from being introduced to the gate start signal line 173, that is, it is possible to prevent the gate driving built-in circuit from being damaged or operated incorrectly by the static electricity introduced to the gate start signal line 173, to thereby prevent deterioration of picture quality. Especially, it is possible to prevent the gate driving built-in circuit from being damaged by the static electricity generated in a manufacturing process of the display apparatus, thereby improving the manufacturing yield of the display apparatus.

Figure 8:
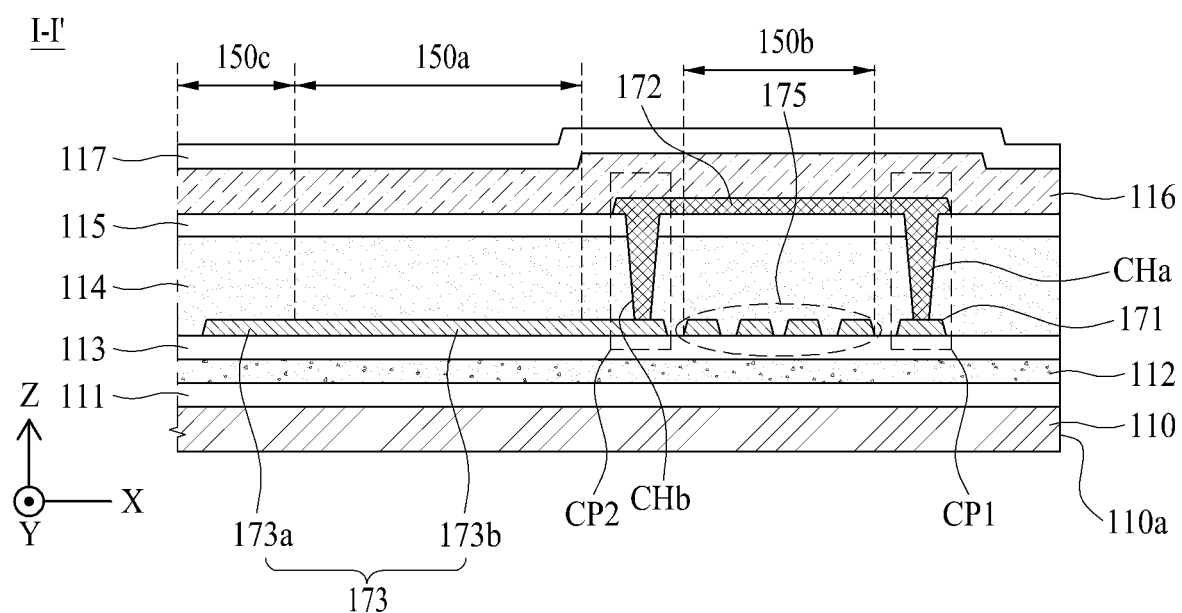
FIG. 8 is another cross sectional view along line I-I' of FIG. 5.

FIG. 8 is another cross sectional view along line I-I' of FIG. 5, which is obtained by changing an arrangement structure of the connection line shown in FIGS. 5 and 6. For the following description of the present application, only the connection line and related parts will be described in detail, and a detailed description for the same parts will be omitted.

As shown in FIG. 8 in connection with FIG. 5, the display apparatus according to the embodiment of the present application may further include a plurality of touch electrodes, and a plurality of touch routing lines. The plurality of touch electrodes may be disposed on the display area (AA), and the plurality of touch electrodes may be overlapped with at least one gate line and at least one data line. The plurality of touch electrodes may be provided on the second insulating layer 116 for covering the protection film 114, and may be covered by the third insulating layer 117. Each of the plurality of touch electrodes may be used as a touch sensor for sensing a touch by the use of touch object, or a common electrode for driving liquid crystal layer. Each of the plurality of touch electrodes may be formed of a transparent conductive material.

Each of the plurality of touch routing lines electrically connects each of the plurality of touch electrodes with the driving integrated circuit 300. The plurality of touch routing lines may be disposed on the first insulating layer 115 along the second direction (Y) while being overlapped with the touch electrodes arranged along the second direction (Y), and may be connected with the plurality of touch electrodes in one-to-one correspondence through touch contact holes provided in the first insulating layer 115. Each of the plurality of touch routing lines may be formed in a single-layered structure or multi-layered structure of any one of molybdenum (Mo), aluminum (Al), chrome (Cr), gold (Au), titanium (Ti), nickel (Ni), neodymium (Nd), and copper (Cu), or their alloys.

The connection line 172 may be provided in an island shape on the first insulating layer 115 for covering the protection film 114 while being crossed and overlapped with the plurality of gate shift clock lines 175. That is, the connection line 172 may be disposed above the plurality of gate shift clock line 175 under the condition that the protection film 114 and the insulating layer 115 are provided between the connection line 172 and the plurality of gate shift clock lines 175. The connection line 172 may be formed in a single-layered structure or multi-layered structure of any one of molybdenum (Mo), aluminum (Al), chrome (Cr), gold (Au), titanium (Ti), nickel (Ni), neodymium (Nd), and copper (Cu), or their alloys. The connection line 172 together with the touch routing line may be disposed on the first insulating layer 115, and may be covered by the second insulating layer 116.

One edge of the connection line 172 may be electrically connected with the first gate link line 171 disposed on the insulating interlayer 113 through the first contact hole (CHa) formed in the first contact portion (CP1) overlapped with the first gate link line 171. The other edge of the connection line 172 according to one embodiment of the present application may be electrically connected with the second line 173b of the gate start signal line 173 through the second contact portion (CP2). In this case, the first contact portion (CP1)

includes the first gate link line 171 and one edge of the connection line 172 that are overlapped with each other under the condition that the first insulating layer 115 and the protection film 114 are interposed in-between, and the first contact hole (CHa) is provided in the protection film 114 and the first insulating layer 115 of the first contact portion (CP1).

The other edge of the connection line 172 may be directly connected with one side of the gate start signal line 173 disposed on the insulating interlayer 113 through the second contact hole (CHb) formed in the second contact portion (CP2) overlapped with one side of the gate start signal line 173. In this case, the other edge of the connection line 172 is overlapped with one side of the gate start signal line 173. Herein, the second contact portion (CP2) includes one side of the gate start signal line 173 and the other edge of the connection line 172, which are overlapped with each other under the condition that the first insulating layer 115 and the protection film 114 are interposed in-between, and the second contact hole (CHb) is provided in the protection film 114 and the first insulating layer 115 of the second contact portion (CP2).

When the connection line 172 is disposed on the first insulating layer 115 for covering the protection film 114, a signal interference between the connection line 172 and the plurality of gate shift clock lines 175 can be reduced. That is, the connection line 172 is provided above the first insulating layer 115 while being crossed with the plurality of gate shift clock lines 175 under the condition that the first insulating layer 115 and the protection film 114 are interposed between the connection line 172 and the plurality of gate shift clock lines 175, thereby reducing a capacitance formed in the crossing area between each of the plurality of gate shift clock lines 175 and the connection line 172. Accordingly, a phase change of the gate start signal supplied to the connection line 172 in accordance with a phase change of the gate shift clock supplied to each of the plurality of gate shift clock lines 175 can be reduced.

Figure 9:
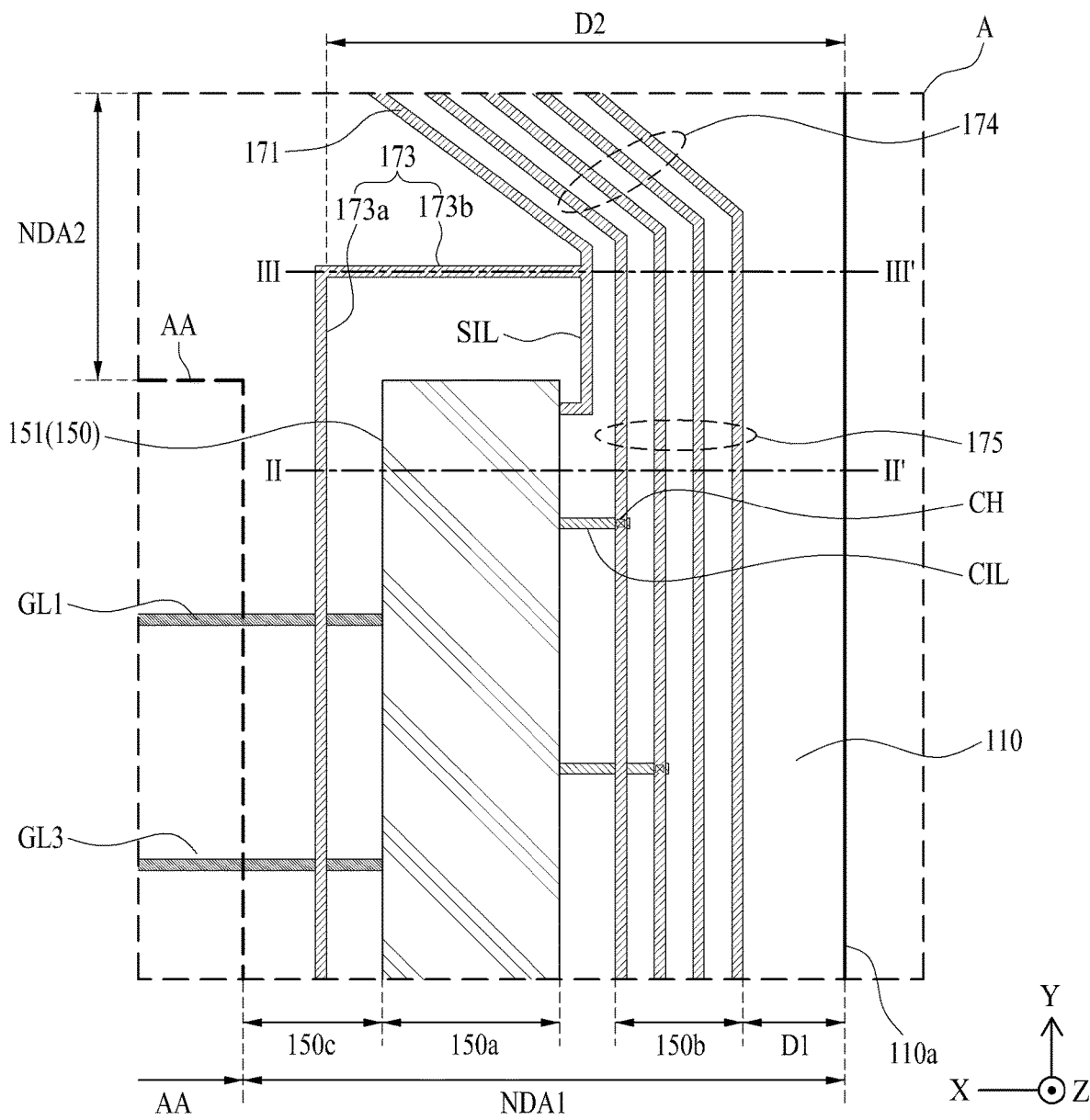
FIG. 9 is another expanded view illustrating portion 'A' of FIG. 2.
Figure 10:
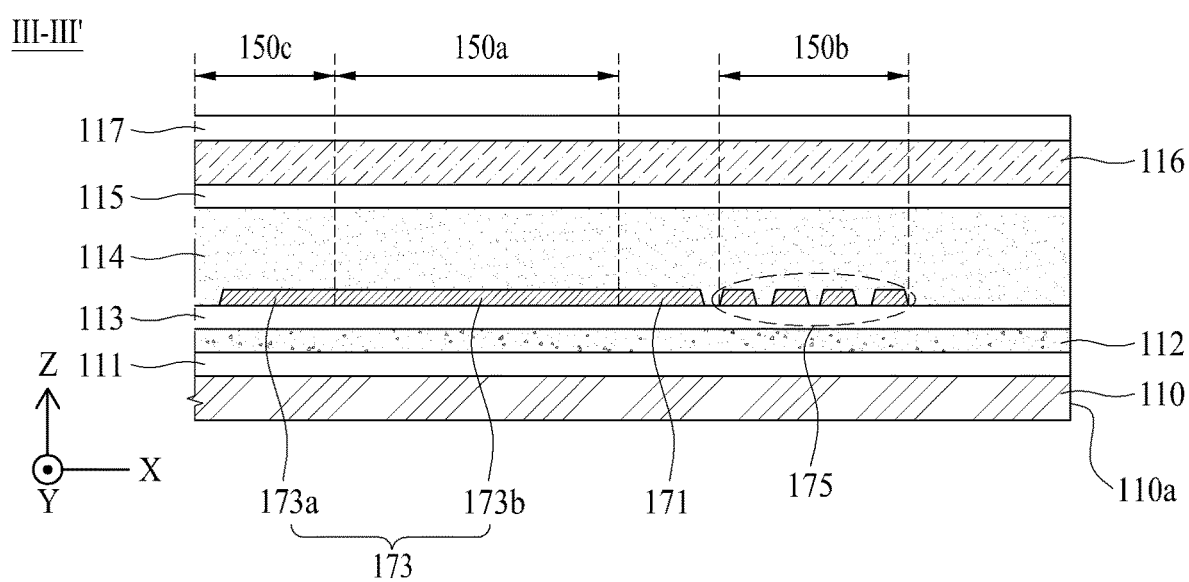
FIG. 10 is a cross sectional view along line of FIG. 9.

FIG. 9 is another expanded view illustrating portion 'A' of FIG. 2, and FIG. 10 is a cross sectional view along line of FIG. 9, which is obtained by changing an arrangement structure of the first gate link line shown in FIG. 5. For the following description of the present application, only the first gate link line and related parts will be described in detail, and a detailed description for the same parts will be omitted. The cross sectional view along line of FIG. 9 is shown in FIG. 7.

As shown in FIGS. 9 and 10 in combination with FIG. 6, the first gate link line 171 is prepared in the second non-display area (NDA2), and is electrically connected with the gate start signal line 173 and the gate start signal output channel of the driving integrated circuit 300. Herein, one side of the first gate link line 171 may be electrically connected with the gate start signal output channel of the driving integrated circuit 300, and the other side of the first gate link line 171 may be electrically connected with one side of the gate start signal line 173, that is, the second line 173b of the gate start signal line 173. The first gate link line 171 together with the gate start signal line 173, the plurality of second gate link lines 174 and the plurality of gate shift clock lines 175 may be provided on the insulating interlayer 113, and may be covered by the protection film 114. That is, the first gate link line 171, the gate start signal line 173, the plurality of second gate link lines 174 and the plurality of gate shift clock lines 175 may be disposed in the same layer.

The first gate link line 171 may be prepared on the insulating interlayer 113 provided in the second non-display area (NDA2), and may be slantly disposed between the gate start signal output channel and one side of the gate start signal line 173. Accordingly, the first gate link line 171 may be farther away from the outer sidewall 110a of the lower substrate 110 in comparison to the plurality of second gate link lines 174, thereby preventing the introduction of static electricity.

Meanwhile, the channel pin map of the driving integrated circuit 300 may be changed in accordance with the arrangement structure of the first gate link line 171 and the plurality of second gate link lines 174.

In an example embodiment, the channel pin map of the driving integrated circuit 300 may be changed, and the plurality of second gate link lines 174 may be disposed closer to the outer sidewall 110a of the lower substrate 110 in comparison to the first gate link line 171, thereby preventing the static electricity from being introduced to the first gate link line 171.

Table 1 shows the driving defective proportion of the gate driving built-in circuit in a related art display apparatus and the display apparatus according to an embodiment of the present application when the static electricity is introduced thereto. The test results of Table 1 are obtained by firstly, secondly, and thirdly introducing the static electricity of 10 kV to portion 'A' shown in FIG. 2, and measuring the driving defective proportion of the gate driving built-in circuit.

As shown in Table 1, in the gate driving built-in circuit of a related art display apparatus, it has the driving defective proportion of 1.6% for the first test, 1.24% for the second test, and 1.29% for the third test so that the manufacturing yield is lowered by 1.377% on the average. Meanwhile, in case of the gate driving built-in circuit of the display apparatus according to the embodiment of the present application, it has the driving defective proportion of 0% for the first to third tests. In comparison to the related art, the example embodiment of the present application enables the manufacturing yield to be improved by 1.377% on average.

TABLE 1

| Test number | Related art | | | Embodiment of the present application | | |
| --- | --- | --- | --- | --- | --- | --- |
| | First test | Second test | Third test | First test | Second test | Third test |
| Driving defective proportion | 1.60% | 1.24% | 1.29% | 0% | 0% | 0% |

Accordingly, the gate start signal line 173 is disposed between the display area (AA) and the gate driving built-in circuit 150 so that the static electricity introduced in a direction from the outer sidewall 110a of the lower substrate 110 to the display area (AA) is not transmitted to the gate start signal line 173, thereby preventing the gate start signal line 173 from being damaged or lost by static electricity. As a result, a malfunction of the gate driving built-in circuit 150 can be prevented and the manufacturing yield of the display apparatus can be improved.

The display apparatus according to example embodiments of the present application may be applied to various manufactured goods, for example, mobile device, image phone, smart watch, watch phone, wearable device, foldable device, rollable device, bendable device, flexible device, curved device, electronic notebook, electronic book, PMP (portable multimedia player), personal digital assistant (PDA), MP3 player, mobile medical device, desktop PC, laptop PC, netbook computer, workstation, navigation, vehicle navigation, vehicle display device, television, wall-paper display device, signage device, game equipment, notebook, monitor, camera, camcorder, home appliances, and the like.

According to example embodiments in accordance with the present application, the display area may include a plurality of pixels arranged in respective areas defined by crossings of the plurality of gate lines and the plurality of data lines with each other, wherein the plurality of gate lines are electrically connected with a gate driving built-in circuit. In accordance with such example embodiments, damage or destruction of the gate start signal line by static electricity can be prevented. As a result, defects in driving the gate driving built-in circuit can be prevented, and the manufacturing yield of the display apparatus can be improved.

Features, structures and effects of the above embodiment of the present application are included in at least one embodiment of the present application, but not limited to one embodiment of the present application. Furthermore, the features, structures and effects described in at least one embodiment of the present application may be variously inter-operated with each other and driven technically as those skilled in the art can sufficiently understand. Thus, it is to be understood that the inter-operated modifications and variations are included within the scope of the present application.

It will be apparent to those skilled in the art that various modifications and variations can be made in the display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus, comprising:
   a substrate including a display area for displaying an image and a non-display area surrounding the display area;
   a driving integrated circuit disposed in the non-display area of the substrate;
   a first clock line portion in the non-display area, the first clock line portion having a plurality of gate shift clock lines;
   a second clock line portion in the non-display area between the first clock line portion and the display area, the second clock line portion having a gate start signal line;
   a gate driving built-in circuit in the non-display area between the first clock line portion and the second clock line portion, and connected with the plurality of gate shift clock lines and the gate start signal line;
   a first gate link line configured between an outermost line of the plurality of gate shift clock lines and a side surface of the substrate and configured to be connected with the driving integrated circuit;
   a connection line electrically connecting the gate start signal line to the first gate link line, and disposed to cross the plurality of gate shift clock lines; and
   a plurality of gate lines electrically connected with the gate driving built-in circuit,
   wherein the gate start signal line is configured to cross the plurality of gate lines disposed between the display area and the gate driving built-in circuit,
   wherein the gate driving built-in circuit comprises a plurality of stages in the non-display area,
   wherein the gate start signal line is extended continuously in parallel with the plurality of stages,
   wherein one side of the gate start signal line is connected with a first stage of the plurality of stages, and the other side of the gate start signal line is connected with the last stage of the plurality of stages,
   wherein the connection line is configured to cross the plurality of gate shift clock lines in the non-display area adjacent to a corner of the substrate between the driving integrated circuit and the gate driving built-in circuit,
   wherein the gate start signal line, the first gate link line, and the plurality of gate shift clock lines are configured on the same layer to each other,
   wherein the connection line is configured on a different layer from the first gate link line and the gate start signal line to each other, and
   wherein one edge of the connection line is electrically connected to the first gate link line through a first contact hole, and the other edge of the connection line is electrically connected to the gate start signal line through a second contact hole.

2. The display apparatus according to claim 1, wherein each corner portion of the substrate has a non-quadrangle shape.

3. The display apparatus according to claim 1, wherein the first clock line portion is between an outer sidewall of the substrate and the gate driving built-in circuit, and
   wherein the gate start signal line is between the display area and the gate driving built-in circuit.

4. The display apparatus according to claim 1, further comprising:
   a plurality of second gate link lines connected between the driving integrated circuit and the plurality of gate shift clock lines,
   wherein the connection line is configured to connect between the gate start signal line and the first gate link line, and to cross the plurality of second gate link lines in the non-display area adjacent to a corner of the substrate between the driving integrated circuit and the gate driving built-in circuit.

5. The display apparatus according to claim 4, wherein the connection line is disposed below the plurality of gate shift clock lines with an insulating interlayer disposed in-between, electrically connected with the first gate link line through the first contact hole provided in the insulating interlayer, and electrically connected with the gate start signal line through the second contact hole provided in the insulating interlayer.

6. The display apparatus according to claim 5, wherein the gate start signal line includes:
   a first line disposed between the display area and the gate driving built-in circuit; and
   a second line curved from one end of the first line, and electrically connected with the connection line through the second contact hole.

7. The display apparatus according to claim 5, further comprising:
   a protection film for covering the plurality of gate shift clock lines and the gate start signal line; and
   an insulating layer for covering the protection film,
   wherein the connection line is disposed above the plurality of gate shift clock lines with the protection film and the insulating layer disposed in-between, electrically connected with the first gate link line through the first contact hole provided in the protection film and the insulating layer, and electrically connected with the gate start signal line through the second contact hole provided in the protection film and the insulating layer.

8. The display apparatus according to claim 7, wherein the gate start signal line includes:
   a first line disposed between the display area and the gate driving built-in circuit; and
   a second line curved from one end of the first line, and electrically connected with the connection line through the second contact hole.

9. The display apparatus according to claim 4, wherein the first gate link line is configured to be closer from the outer sidewall of the substrate in comparison to the plurality of second gate link lines.

10. The display apparatus according to claim 9, wherein the gate start signal line includes:
    a first line disposed between the display area and the gate driving built-in circuit; and
    a second line curved from one end of the first line, and electrically connected with the connection line.

11. The display apparatus according to claim 1, wherein a minimum distance between an outer edge of the substrate and the gate shift clock lines is equal to or greater than 140 µm, and is equal to or less than 150 µm.

12. The display apparatus according to claim 11, wherein an interval between adjacent ones of the gate shift clock lines is equal to or greater than 5 µm, and is equal to or less than 10 µm.

13. The display apparatus according to claim 1, wherein a distance between the outer sidewall of the substrate and the gate start signal line is equal to or greater than 600 µm, and is equal to or less than 700 µm.

14. The display apparatus according to claim 1, wherein the display area includes a plurality of pixels arranged in respective areas defined by crossing the plurality of gate lines and a plurality of data lines with each other.

15. The display apparatus according to claim 1, further comprising a plurality of clock input lines configured to selectively connect at least one of the plurality of gate shift clock lines to each of the plurality of stages, respectively,
    wherein the gate start signal line and the connection line are configured not to cross each of the plurality of clock input lines.

16. A display apparatus, comprising:
    a substrate having a display area, and a non-display area surrounding the display area;
    a driving integrated circuit disposed in the non-display area of the substrate;
    first and second gate driving built-in circuits in the non-display area at opposing sides of the display area such that the display area is interposed between the first and second gate driving built-in circuits;
    a plurality of first gate shift clock lines connected with the first gate driving built-in circuit;
    a plurality of second gate shift clock lines connected with the second gate driving built-in circuit;
    a first gate start signal line connected with the first gate driving built-in circuit;
    a second gate start signal line connected with the second gate driving built-in circuit;
    a first gate link line configured between an outermost line of the plurality of first gate shift clock lines and one side surface of the substrate and configured to be connected with the driving integrated circuit;
    a second gate link line configured between an outermost line of the plurality of second gate shift clock lines and the other side surface of the substrate and configured to be connected with the driving integrated circuit;
    a first connection line electrically connecting the first gate start signal line to the first gate link line, and disposed to cross the plurality of first gate shift clock lines;
    a second connection line electrically connecting the second gate start signal line to the second gate link line, and disposed to cross the plurality of second gate shift clock lines; and
    a plurality of gate lines electrically connected with the first or second gate driving built-in circuit,
    wherein the first or second gate start signal line crosses the plurality of gate lines disposed between the display area and the first or second gate driving built-in circuit,
    wherein each of the first and second gate start signal lines is disposed closer to the display area in comparison to the first and second gate shift clock lines, respectively,
    wherein each of the first and second gate driving built-in circuits comprises a plurality of stages,
    wherein each of the first and second gate start signal lines is extended continuously in parallel with the plurality of stages,
    wherein one side of the each of the first and second gate start signal lines is connected with a first stage of the plurality of stages, and the other side of the each of the first and second gate start signal lines is connected with the last stage of the plurality of stages,
    wherein the first connection line is configured to cross the plurality of first gate shift clock lines in the non-display area adjacent to one side corner of the substrate between the driving integrated circuit and the first gate driving built-in circuit,
    wherein the second connection line is configured to cross the plurality of second gate shift clock lines in the non-display area adjacent to the other side corner of the substrate between the driving integrated circuit and the second gate driving built-in circuit,
    wherein the first and second gate start signal line, the first and second gate link lines, and the plurality of first and second gate shift clock lines are configured on the same layer to each other,
    wherein the first and second connection lines are configured on a different layer from the first and second gate link lines and the first and second gate start signal lines to each other,
    wherein one edge of the first connection line is electrically connected to the first gate link line through a first contact hole, and the other edge of the first connection line is electrically connected to the first gate start signal line through a second contact hole, and
    wherein one edge of the second connection line is electrically connected to the second gate link line through a first contact hole, and the other edge of the second connection line is electrically connected to the second gate start signal line through a second contact hole.

17. The display apparatus according to claim 16, wherein the first gate start signal line is between the first gate driving built-in circuit and the display area, and
    wherein the second gate start signal line is between the second gate driving built-in circuit and the display area.

18. The display apparatus according to claim 16, wherein each corner portion of the substrate has a non-quadrangle shape.

19. The display apparatus according to claim 16,
    wherein the display area includes a plurality of pixels arranged in respective areas defined by crossing the plurality of gate lines and a plurality of data lines with each other, wherein the first gate start signal line crosses the plurality of gate lines disposed between the display area and the first gate driving built-in circuit, and wherein the second gate start signal line crosses the plurality of gate lines disposed between the display area and the second gate driving built-in circuit.

20. The display apparatus according to claim 16, further comprising:

a plurality of first clock input lines configured to selectively connect at least one of the plurality of first gate shift clock lines to each of the plurality of stages of the first gate driving built-in circuit, respectively, and a plurality of second clock input lines configured to selectively connect at least one of the plurality of second gate shift clock lines to each of the plurality of stages of the second gate driving built-in circuit, respectively, wherein the first gate start signal line and the first connection line are configured not to cross each of the first plurality of clock input lines, and wherein the second gate start signal line and the second connection line are configured not to cross each of the second plurality of clock input lines.

\* \* \* \* \*